(12) United States Patent
Zhu et al.

(10) Patent No.: US 12,002,707 B2
(45) Date of Patent: Jun. 4, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Bingyu Zhu, Hefei (CN); Hai-Han Hung, Hefei (CN); Jingwen Lu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 190 days.

(21) Appl. No.: 17/471,256

(22) Filed: Sep. 10, 2021

(65) Prior Publication Data

US 2022/0044961 A1 Feb. 10, 2022

Related U.S. Application Data

(63) Continuation of application No. PCT/CN2021/103703, filed on Jun. 30, 2021.

(30) Foreign Application Priority Data

Aug. 6, 2020 (CN) .......................... 202010784644.X

(51) Int. Cl.
*H01L 21/762* (2006.01)
*H01L 21/265* (2006.01)
*H01L 21/266* (2006.01)

(52) U.S. Cl.
CPC .. *H01L 21/76237* (2013.01); *H01L 21/26506* (2013.01); *H01L 21/266* (2013.01)

(58) Field of Classification Search
CPC .................................... H01L 21/76224–76237
See application file for complete search history.

(56) References Cited

U.S. PATENT DOCUMENTS 5,940,718 A * 8/1999 Ibok ................. H01L 21/76232
257/E21.549
6,368,940 B1 4/2002 Amon
(Continued)

FOREIGN PATENT DOCUMENTS

CN 1415116 A 4/2003
CN 101295663 A 10/2008
(Continued)

OTHER PUBLICATIONS

Machine language translation of KR 2004-0089391-A (Year: 2004).*

*Primary Examiner* — Erik Kielin
(74) *Attorney, Agent, or Firm* — Cooper Legal Group, LLC

(57) ABSTRACT

Provided are a semiconductor structure and a manufacturing method thereof. The manufacturing method for the semiconductor structure comprises: providing a substrate, wherein the substrate comprises active regions and isolation regions each located between the adjacent active regions, and each of the active regions comprises corner regions adjacent to the isolation regions; performing a doping process to implant doping ions into the corner regions, wherein the doping ions are configured to slow down an oxidation rate of the corner regions; and performing a removing process to remove the oxidized portion of the substrate after the doping process, wherein during the removing process, a side wall of each of the corner regions is exposed from a structure in the isolation region.

12 Claims, 15 Drawing Sheets

(56) References Cited

U.S. PATENT DOCUMENTS

| | | | |
|---|---|---|---|
| 2002/0182826 | A1 | 12/2002 | Cheng |
| 2004/0063299 | A1* | 4/2004 | Imade ............. H01L 21/823481 257/E21.546 |
| 2006/0030136 | A1* | 2/2006 | Chen ................. H01L 21/76232 257/E21.549 |
| 2015/0021735 | A1* | 1/2015 | Wen .................. H01L 21/76205 438/425 |

FOREIGN PATENT DOCUMENTS

| | | | |
|---|---|---|---|
| CN | 1926679 | B | 10/2010 |
| CN | 105655284 | A | 6/2016 |
| CN | 107919387 | A | 4/2018 |
| CN | 110911343 | A | 3/2020 |
| KR | 2004-0089391 | A * | 10/2004 |

\* cited by examiner

SEMICONDUCTOR STRUCTURE AND MANUFACTURING METHOD THEREOF

CROSS-REFERENCE TO RELATED APPLICATION

This is a continuation application of International Patent Application No. PCT/CN2021/103703, filed on Jun. 30, 2021, which claims priority to Chinese patent application No. 202010784644.X, filed on Aug. 6, 2020 and entitled "Semiconductor Structure and Manufacturing Method Thereof". The disclosures of International Patent Application No. PCT/CN2021/103703 and Chinese patent application No. 202010784644.X are incorporated by reference in their entireties.

TECHNICAL FIELD

This application relates to a semiconductor structure and a manufacturing method thereof.

BACKGROUND

Along with miniaturization of the size of a semiconductor structure, extra consumption of a film material during a manufacturing process of the semiconductor structure may cause a significant performance deficiency.

Specifically, the semiconductor structure generally includes an array region and a peripheral region surrounding the array region. When bottom substrates of the array region and the peripheral region are subjected to etching, cleaning and other processes, the bottom substrates will be partially consumed, and even a film peeling phenomenon is generated. Consumption of a substrate material will cause a performance defect on the substrates, for example, electric leakage, etc.

SUMMARY

Embodiments of this application provide a method for manufacturing a semiconductor structure. In the method, a substrate is provided, the substrate includes active regions and isolation regions each located between the adjacent active regions, and each of the active regions includes corner regions adjacent to the isolation regions. A doping process is performed, to implant doping ions into the corner regions, the doping ions are configured to slow down the oxidation rate of the corner regions. After the doping process, a removing process is performed. The removing process may remove an oxidized portion of the substrate. During the removing process, a side wall of each of the corner regions is exposed from a structure in the isolation region.

According to the embodiments of this application, the embodiments of this application further provide a semiconductor structure, including a substrate, the substrate includes active regions and isolation regions each located between the adjacent active regions. Each of the active regions includes corner regions adjacent to the isolation regions. A side wall of each of the corner regions is exposed from a structure in the isolation region. The corner regions include doping ions, which are configured to slow down the oxidation rate of the corner regions.

BRIEF DESCRIPTION OF THE DRAWINGS

One or more embodiments are exemplarily described through figures in the drawings corresponding to the embodiments, and these example descriptions do not constitute a limitation to the embodiment. Unless otherwise stated, the figures in the drawings do not constitute a proportional limitation.

DETAILED DESCRIPTION

Figure 1:
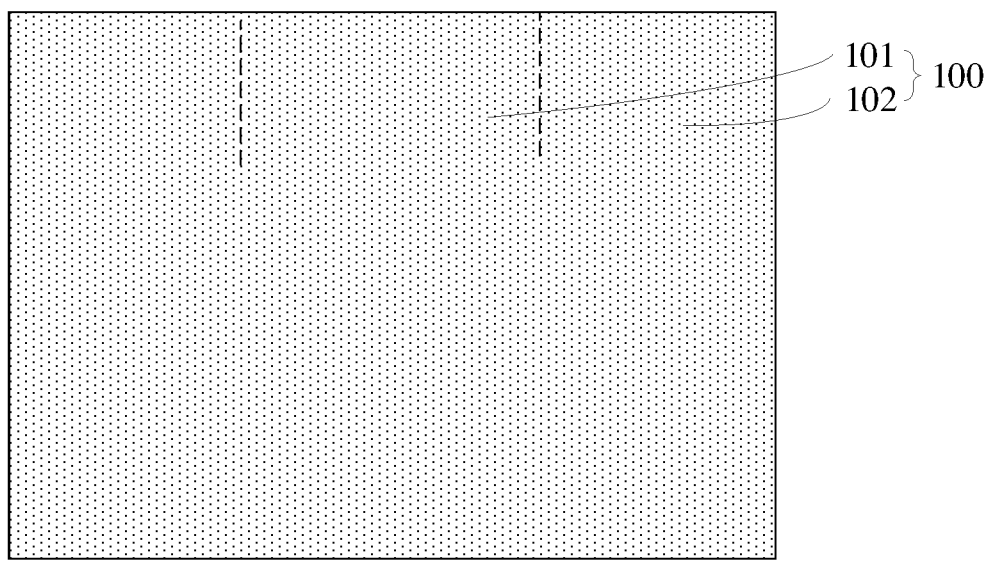
FIG. 1-FIG. 5 are schematic sectional views showing each step of a method for forming a semiconductor structure.

Referring to FIG. 1, a substrate 100 is provided. The substrate 100 includes active regions 101 and isolation regions 102 located between the adjacent active regions 101. Each active region 101 includes a corner region adjacent to the isolation region 102.

The substrate 100 includes polycrystalline silicon. A subsequent removing process performed on the substrate 100 is mostly performed under an atmospheric environment, and the polycrystalline silicon is naturally oxidized under the atmospheric environment.

It should be noted that, in the figures herein, a dotted line is a dividing line intended to divide the substrate into active regions 101 and the isolation regions 102, and is merely used as illustrative purpose. Actually, the dividing line is not necessarily vertical to the surface of the substrate 100, and may be at a certain inclined angle which may be equal to an inclined angle of a trench side wall formed by subsequent etching.

Figure 2:
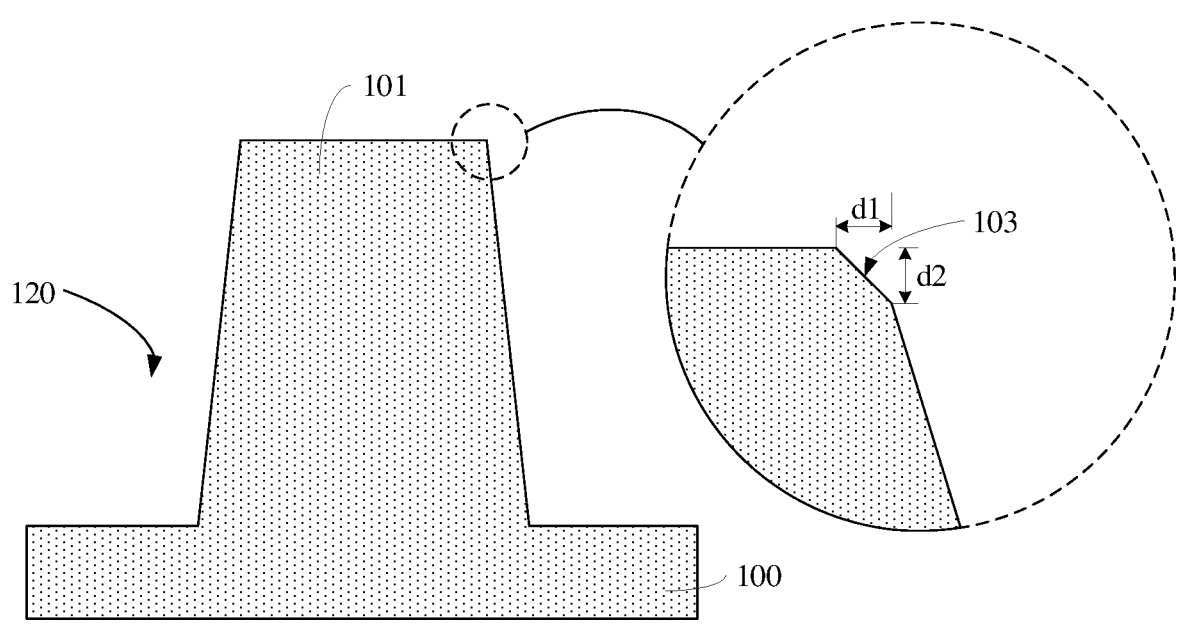

Referring to FIG. 2, an etching process is performed to each of the isolation regions 102 to form a trench 120 configured to form an isolation structure.

During the etching process for forming the trench 120, a side wall of the corner region of the active region 101 may be exposed, and the exposed side wall of the corner region may be oxidized. An oxide layer formed by the oxidization can be more easily removed through the etching process than the material of the substrate 100.

Since the etching process for forming the trench 120 is a continuous process, and since an etching agent used in the etching process contacts with the exposed side wall of the corner region, the oxide formed at the side wall of the corner region through natural oxidation will be etched and removed in a shorter time. A portion of the substrate 100 at the side wall of the corner region is always exposed to the atmospheric environment, and an oxide layer formed through the oxidation cannot effectively isolate oxygen in air. Thus, the side wall of the corner region of the substrate 100 is always oxidized in a faster oxidation rate (namely the oxidation rate in the case where the substrate 100 directly contacts with the air), then causing that the substrate 100 is consumed in a faster rate, and finally, a greater chamfer 103 is formed.

The chamfer 103 has a first width d1 in a direction parallel to the surface of the substrate 100 and a first thickness d2 in a direction vertical to the surface of the substrate, and the first width d1 has no specific correspondence relationship with the first thickness d2. The sizes of the first width d1 and the first thickness d2 both depend on the etching time for the trench 120 and the oxidation rate in the case where the substrate 100 directly contacts with the air. Specifically, the faster the oxidation rate in the case where the substrate 100 directly contacts with the air, the greater the first width d1 and the first thickness d2.

Figure 3:
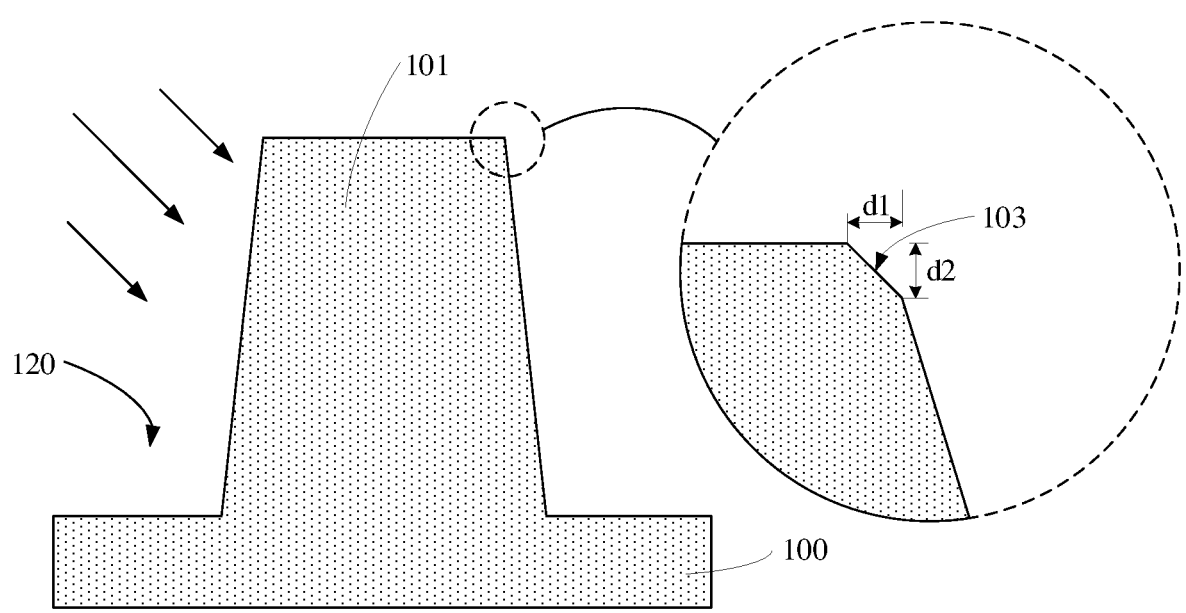

Referring to FIG. 3, after the trench 120 is formed, a first cleaning process is performed to the bottom and the side wall of the trench 120 to remove the residual etching agent and fragments of the substrate 100.

In the first cleaning process, a cleaning agent comes into contact with the substrate 100 at the chamfer 103, and the oxide layer formed through natural oxidation is removed, so that the substrate 100 is further consumed. Specifically, the first width d1 and the first thickness d2 of the chamfer 103 will be further increased, and then a chamfer 103 with a greater size is formed.

Figure 4:
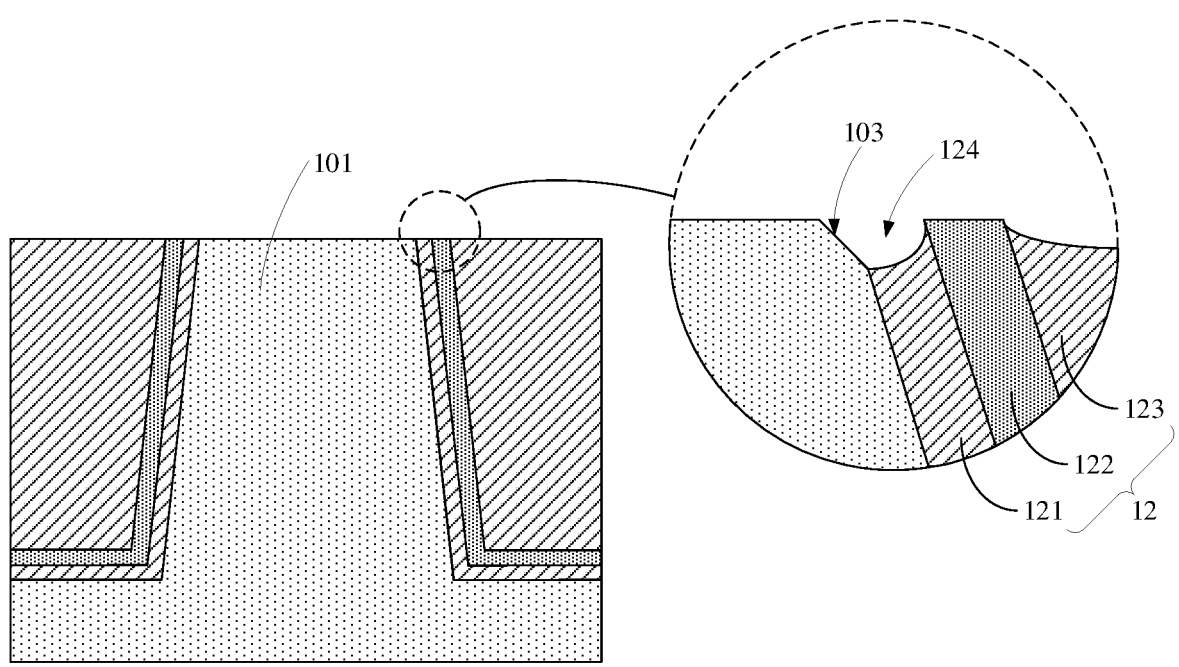

Referring to FIG. 4, after the first cleaning process is performed, an isolation structure 12 is formed in the trench 120 (referring to FIG. 3).

The isolation structure 12 generally includes a first isolation layer 121 covering the bottom and side wall of the trench 120, a second isolation layer 122 covering the bottom and side wall of the first isolation layer 121 and a third isolation layer 123 filling the trench 120. The materials of the first isolation layer 121 and the third isolation layer 123 generally are silicon oxide, the material of the second isolation layer 122 generally is silicon nitride, namely they forms a Oxygen-Nitride-Oxygen (ONO) isolation structure.

The silicon nitride has a higher hardness. When the silicon nitride and the silicon oxide are etched, due to an etching selection ratio, the first isolation layer 121 is usually over-etched and cannot cover the entire surface of the chamfer 103, namely the isolation structure 12 has a recess 124 located at the top of the first isolation layer 121, and at least part of side wall of the corner region may be exposed from the recess 124. Thus, the size of the chamfer 103 will be further increased in the other subsequent removing process.

Figure 5:
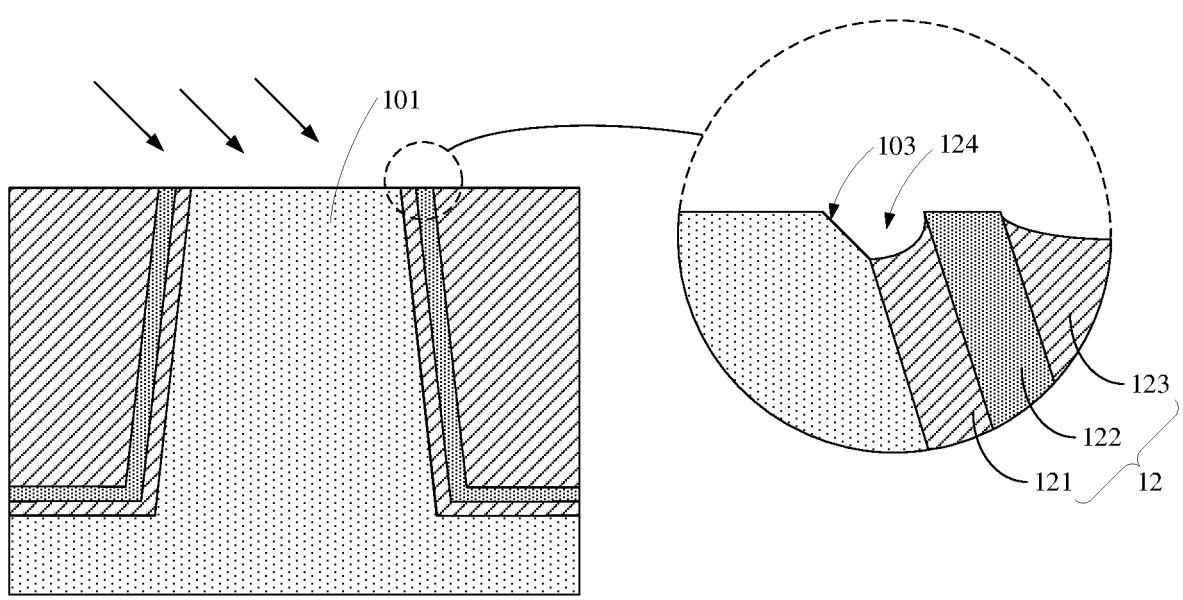

Referring to FIG. 5, after the isolation structure 12 is formed, a second cleaning process is performed to the top of each active region 101 to remove impurities on the top surface of the active region 101.

The second cleaning process is an operation before depositing and forming a gate dielectric layer on the top surface of each active region 101. During the second cleaning process, the cleaning agent comes into contact with the exposed side wall of each corner region, to remove the oxide on the side wall of the corner region by etching. The size of the chamfer 103 is further increased, and thus integrity of the corner region of the active region 101 becomes poor.

In order to solve the above problem, the embodiments of the present application provide a semiconductor structure and a manufacturing method thereof. The oxidation rate of the corner region is slowed down by implanting doping ions to the corner region of each active region. Thus, when the etching agent or cleaning agent and other solvents of the removing process come into contact with the side wall of each corner region, an oxide film is thinner. The size of the chamfer is positively related to the thickness of the oxide film, so the size of the chamfer can be effectively reduced by restraining the oxidization of the corner region, which is beneficial to ensure better structural integrity of the corner region in the active region.

In order to make the objectives, technical solution and advantages of this application clearer, the embodiments of this application will be described in detail below in conjunction with the drawings. However, those of ordinary skill in the art may understand that, in various embodiments of this application, various technical details are provided for readers to understand this application better. However, even without these technical details as well as various changes and modifications based on the embodiments below, the technical solution protected by this application may also be implemented.

FIG. 6-FIG. 14 are sectional structural schematic diagrams corresponding to each step of a method for forming a semiconductor structure according to the embodiments of the present application.

Figure 6:
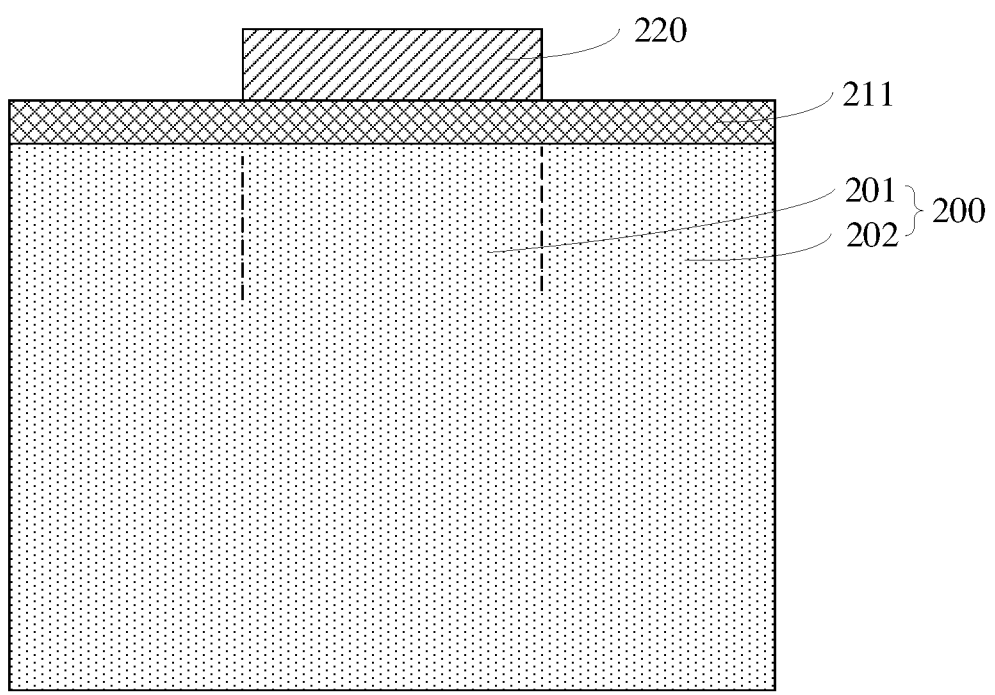
FIG. 6-FIG. 15 are schematic sectional views showing each step of a method for forming a semiconductor structure according to the embodiments of the present application.

Referring to FIG. 6, a substrate 200 is provided, and a mask layer 220 and a shielding film 211 are successively stacked on the substrate 200.

In this embodiment, the substrate 200 includes active regions 201 and isolation regions 202 each located between the adjacent active regions 201. The positive projection of the top surface of the active region 201 in a direction perpendicular to the surface of the substrate 200 is coincided with the positive projection of the mask layer 220. Thus, the subsequent etching for forming trench can be performed by using the mask layers 220, without forming the different mask layers to perform the subsequent ions doping and the etching respectively. As such, it is beneficial to reduce the process step and shorten the exposure time of the top surface of the substrate 200, and reduce the consumption of the substrate 200.

In this embodiment, the mask layer 220 is a hard mask layer, the material of the mask layer 220 includes polycrystalline silicon. The shielding film 211 is configured to form the shielding layer, which can shield the ion implantation. The material of the shielding film 211 includes silicon oxide.

The substrate 200 is generally divided into an array region and a peripheral region surrounding the array region. In this embodiment, for example, the region where the substrate 200 is located is the peripheral region. The mask layer 220 may be formed together with a polycrystalline silicon layer of the array region.

Figure 7:
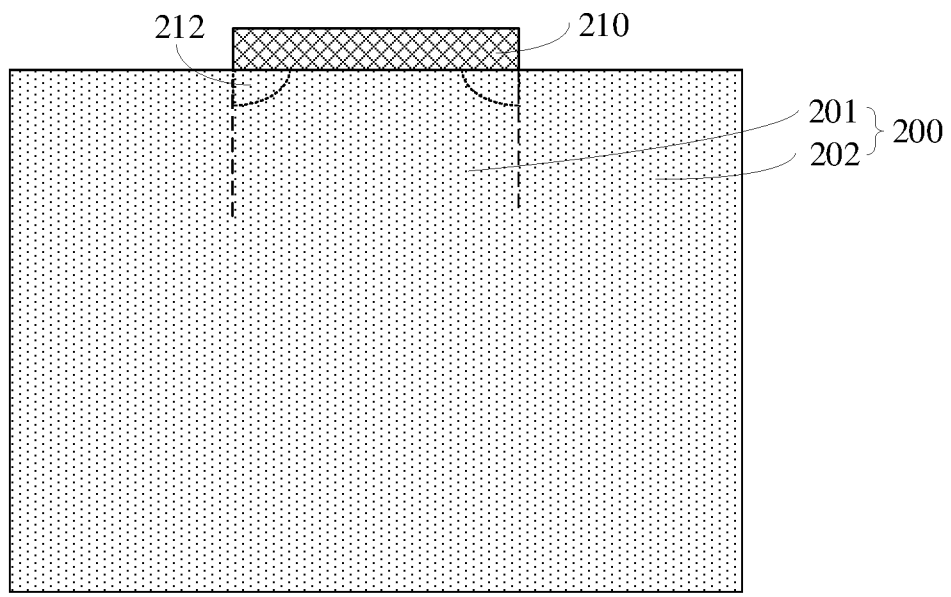

Referring to FIG. 7, the shielding film 211 is etched to form the shielding layer 210, and the mask layer 220 is removed.

In this embodiment, the active region 201 includes a corner region 212 adjacent to the isolation region 202, and the shielding layer 210 covers the top surface of the corner region 212. In other embodiment, the top surface of the corner region is exposed from the shielding layer.

Figure 8:
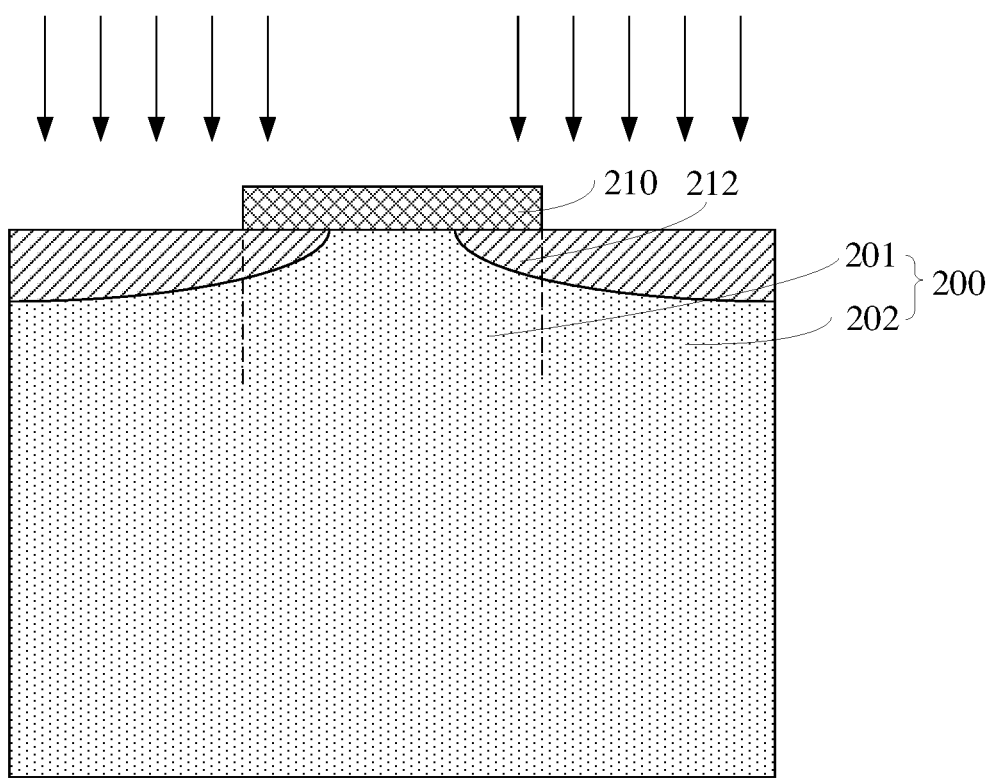

Referring to FIG. 8, a doping process is performed.

In this embodiment, an ion implantation having an implantation angle is adopted to perform ion implantation on the top of the corner region 212 and the isolation region 202. In another embodiment, only the corner region is subjected to the ion implantation.

The type of the doping ion is related to the oxidization of the side wall of the corner region 212. Specifically, the side wall of the corner region 212 may be naturally oxidized, namely oxidized by the oxygen contained in the air of the atmospheric environment, or oxidized by the oxidization components in the solvents, such as the etching agent or cleaning agent. The oxidization components in different solvents may be different. Therefore, the type of the doping ion may be adjusted according to the solvent type used in the subsequent process step and duration of the substrate 200 exposing to the atmospheric environment. In addition, various doping ions may be doped in the corner region 212 so as to slow down the oxidization rate of the corner region 212 at different oxidization environments.

In this embodiment, the doping ions include nitrogen ions, and the implantation dose of the doping ions is 1e12 to 1e16 (i.e. $1\times10^{12}$ to $1\times10^{16}$) atoms/cm$^2$, for example, 1e13 (i.e. $1\times10^{13}$) atoms/cm$^2$, 1e14 (i.e. $1\times10^{14}$) atoms/cm$^2$ or 1e15 (i.e. $1\times10^{15}$) atoms/cm$^2$. If the implantation dose of the doping ion is too low, the effect of slowing down the oxidization rate is not obvious, and a greater chamfer will be still formed. If the implantation dose of the doping ion is excessive, the effect of slowing down the oxidization rate will not be obviously improved, and damage may also be caused to the corner region 212, which is not beneficial to subsequently dope type-P or type-N doping ion and to form a doping region.

In this embodiment, the scope of the implantation energy of the ion implantation is 1 KV to 60 KV, for example, 20 KV, 30 KV or 40 KV. If the implantation energy is too low, the implantation depth of the doping ion is shallower, and the corner region capable of reducing the consumption is thinner. If the implantation energy is too high, damage may be caused to the substrate 200 due to a deep range of the implantation.

In this embodiment, the implantation angle is 5 to 60 degrees, for example, 20 degrees, 30 degrees or 40 degrees. If the implantation angle is too small, a poor doping effect at the top region of the corner region 212 may be caused. If the implantation angle is too great, great implantation energy is required to implant the doping ion to a preset depth, and unnecessary doping is easily introduced to a central region between the adjacent corner regions 212, and the unnecessary doping may affect the performance of a subsequently formed semiconductor structure.

In this embodiment, a removing process is performed to remove an oxidized portion of the substrate 200 after the doping process. During the removing process, the side wall of each corner region 212 is exposed from a structure in the isolation region 202. The removing process includes an etching process and a cleaning process, etc.

Specifically, the removing process performed after the doping process may include the following operations.

Figure 9:
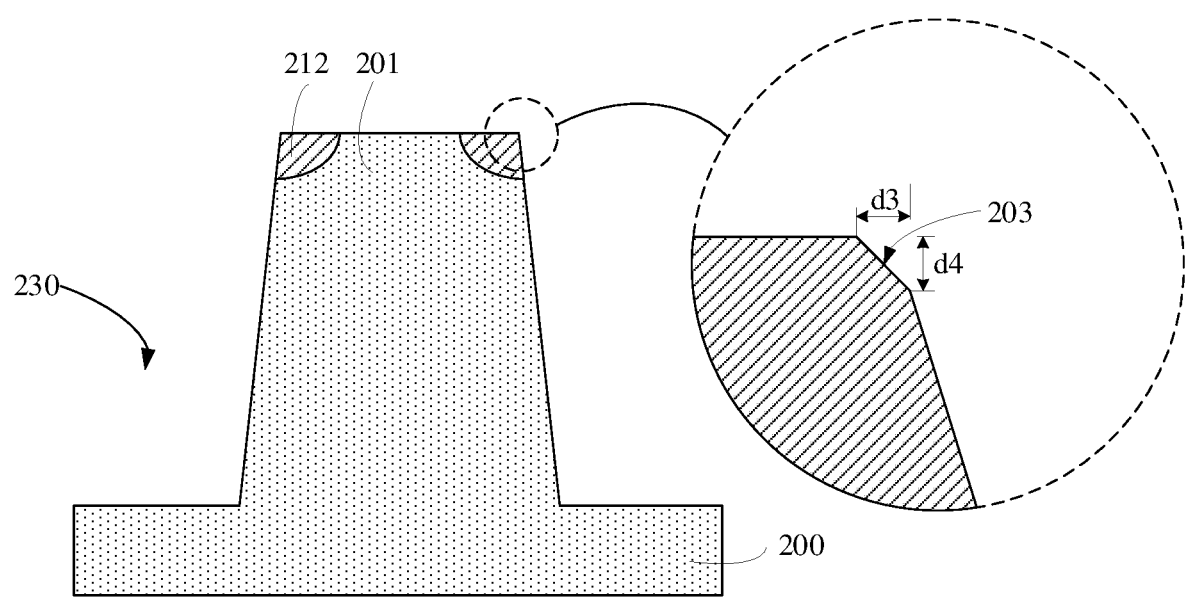

Referring to FIG. 9, an etching process is performed to each isolation region 202 (referring to FIG. 8) to form trenches 230 from which the side walls of the corner regions 212 are exposed, and the trench 230 is configured to form an isolation structure.

In this embodiment, doping ions are doped in the corner region 212, and thus the natural oxidization rate and the oxidization rate for the oxidization components in the etching agent are relatively slow when the side wall of the corner region 212 is exposed. During the whole etching process, the total thickness of the oxide film capable of being etched by the etching agent is thinner.

Thus, the film peeling phenomenon caused by excessive consumption of the side wall material of the corner region 212 is avoided, and the oversized chamfer 203 formed due to the film peeling phenomenon or other reasons is also avoided. Therefore, it is possible to ensure that the second width d3 and the second thickness d4 of the chamfer 203 are small, so the corner region 212 has better structural integrity, and an electric leakage risk caused by a structure deficiency is avoided.

Figure 10:
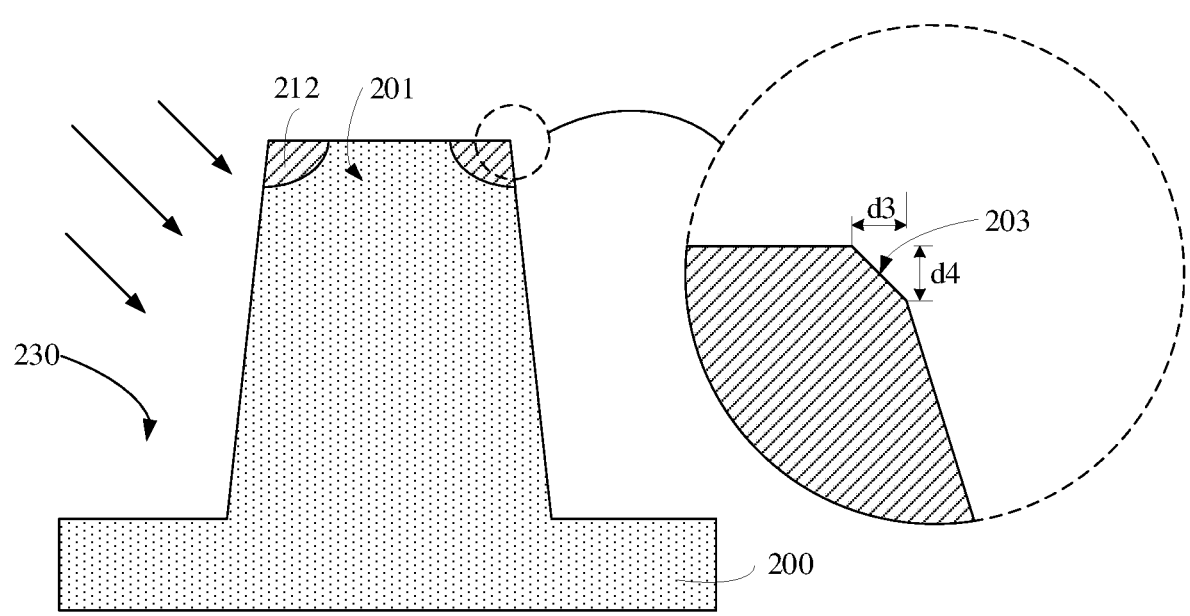

Referring to FIG. 10, a first cleaning process is performed to the trenches 230 after the etching process, and cleaning liquid of the first cleaning process comes into contact with the side wall of each corner region 212.

In this embodiment, the doping ions for slowing down the doping rate are doped in the corner region 212, the doping ions can restrain the natural oxidization of the substrate 200 from the etching process to the first cleaning process, and also restrain the oxidization of oxidization compositions in the cleaning liquid to the substrate 200, so as to ensure that total thickness of the oxide film removed by the first cleaning process is thinner. Thus, it is beneficial to restrain the further consumption of the material of the corner region 212 caused by the first cleaning process, and ensure the better structural integrity of the corner region 212.

Figure 11:
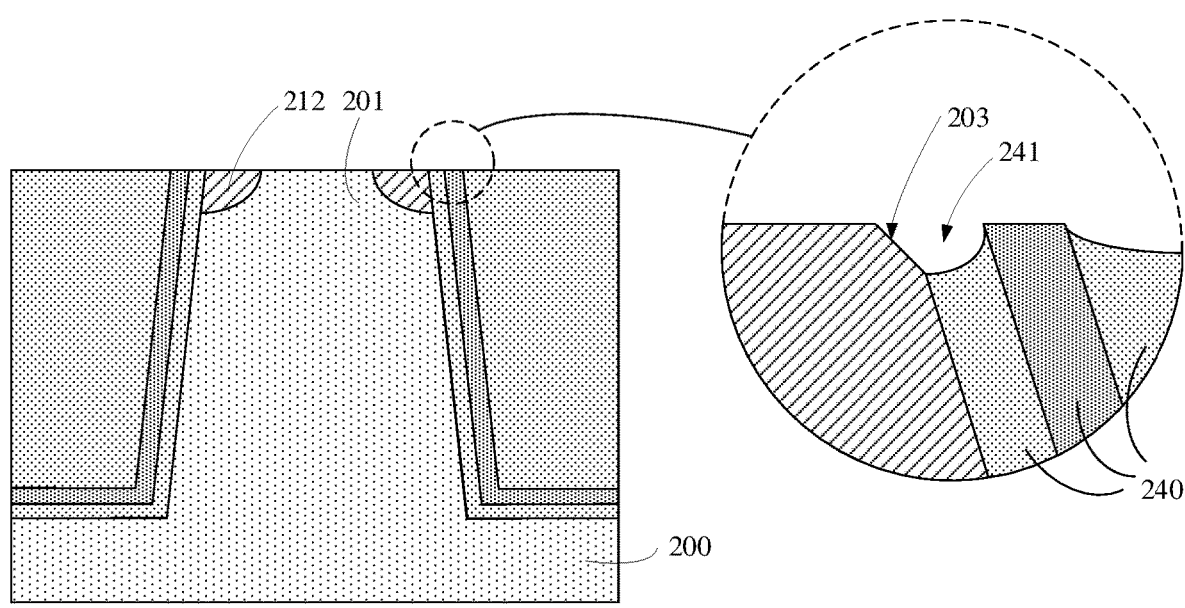

Referring to FIG. 11, an isolation structure 240 is formed.

In this embodiment, the isolation structure 240 is a three-layer stack of a silicon oxide layer, a silicon nitride layer and a silicon oxide layer. The isolation structure 240 is provided with a recess 241 from which the side wall of the corner region 212 is exposed. In another embodiment, the isolation structure may also be a double-layer stack including a silicon oxide layer and a silicon nitride layer. However, the structure and material of the isolation structure 240 are not limited hereto, it is only intended to emphasize that the isolation structure 240 has a certain loophole, which includes the recess 241 through which the side wall of the corner region 212 is exposed.

It should be noted that, if the corner region 212 is subjected to ion doping after the isolation structure 240 is formed so as to restrain the formation of the chamfer 203 or reduce the size of the chamfer 203, the thickness of the corner region 212 in a direction vertical to the surface of the substrate 200 may be only equal to that of the recess 241. In this way, it is beneficial to reduce the quantity of the doping ions needed to be implanted and shorten the ion implantation range, so that the ion implantation process has little damage on the corner region 212, and a better electric performance of the active region 201 is ensured.

Figure 12:
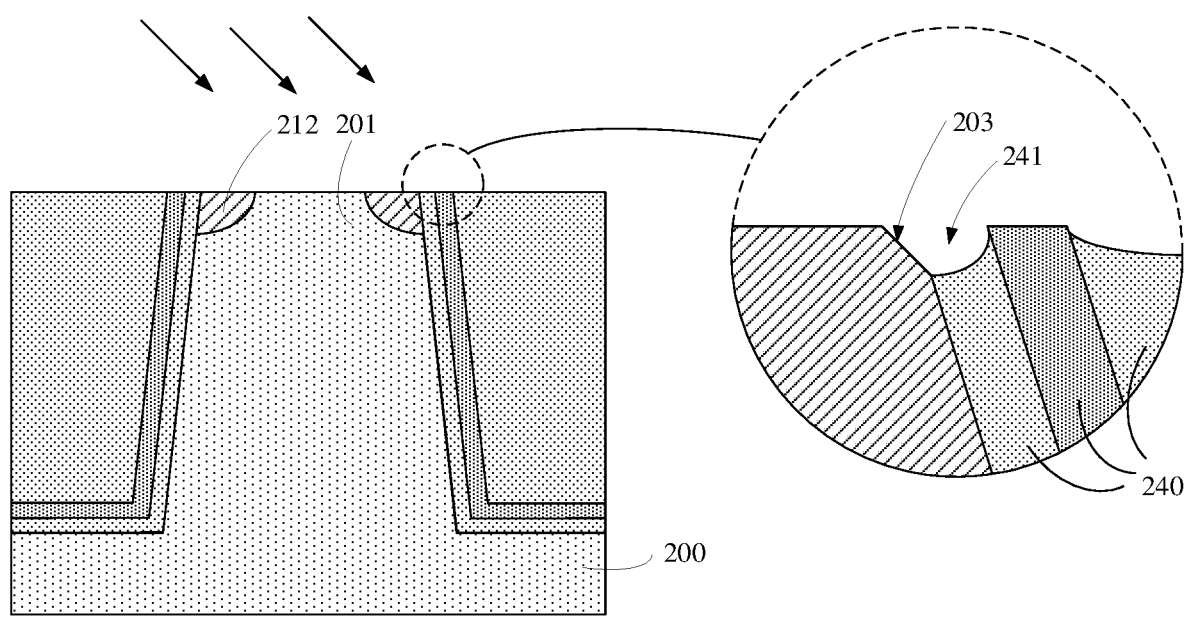

Referring to FIG. 12, a second cleaning process is performed to the top surface of each active region 201 after the doping process, and a cleaning liquid of the second cleaning process comes into contact with the side wall of each corner region 212.

In this embodiment, the doping ions may also restrain the natural oxidization from the formation of the isolation structure 240 to the second cleaning process, and restrain the natural oxidization of the side wall of the corner region 212 and the oxidization caused by the cleaning agent during the second cleaning process. Thus, the structural integrity of the corner region 212 is further ensured.

Figure 13:
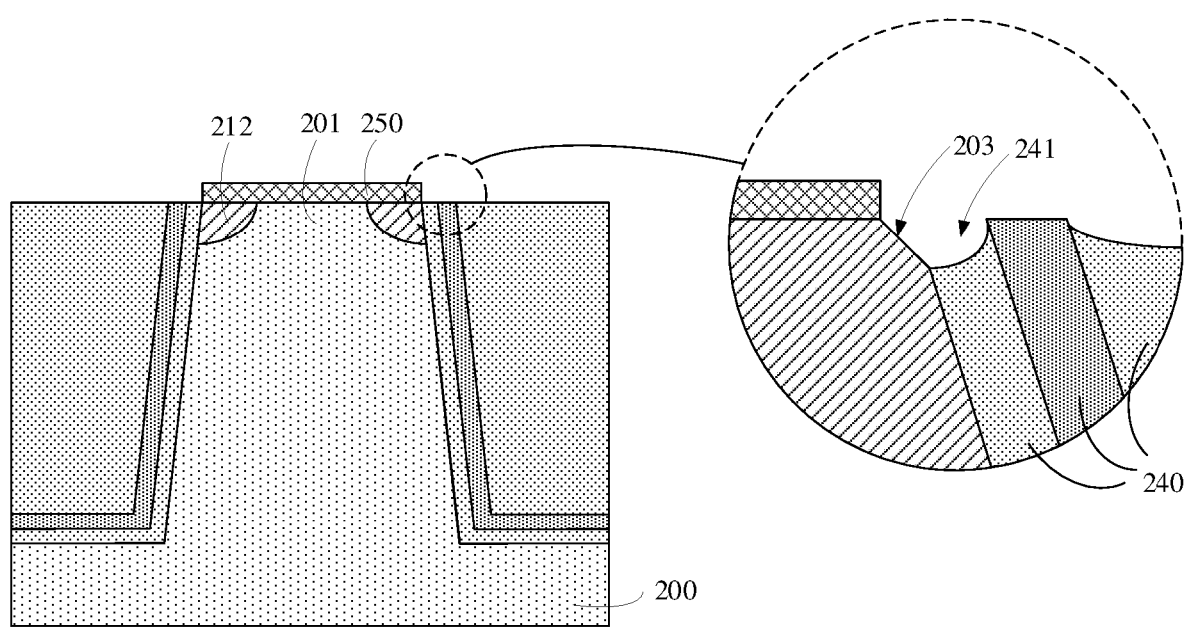

Referring to FIG. 13, a depositing process is performed to the top surface of each active region 201 after the second cleaning process, to form a gate dielectric layer 250.

In this embodiment, the gate dielectric layer 250 only covers the top surface of the active region 201. Usually, the forming process of the gate dielectric layer 250 is as follows: a whole layer of gate dielectric film is firstly formed on the substrate 200, and then the gate dielectric film is subjected to graphical etching. When the gate dielectric layer 250 does not cover the side wall of the corner region 212, the etching process will remove an oxide film on the side wall of the corner region 212.

The doping ions for slowing down the doping rate are doped in the corner region 212, the doping ions can restrain the natural oxidization of the substrate 200 during an etching process, and restrain the oxidization of the substrate 200 caused by the oxidization compositions in the etching agent, so as to ensure that the oxide film to be removed by the etching process has thinner total thickness. Thus, it is beneficial to restrain the further consumption of the material of the corner region 212 caused by the etching process, and ensure the better structural integrity of the corner region 212.

Figure 14:
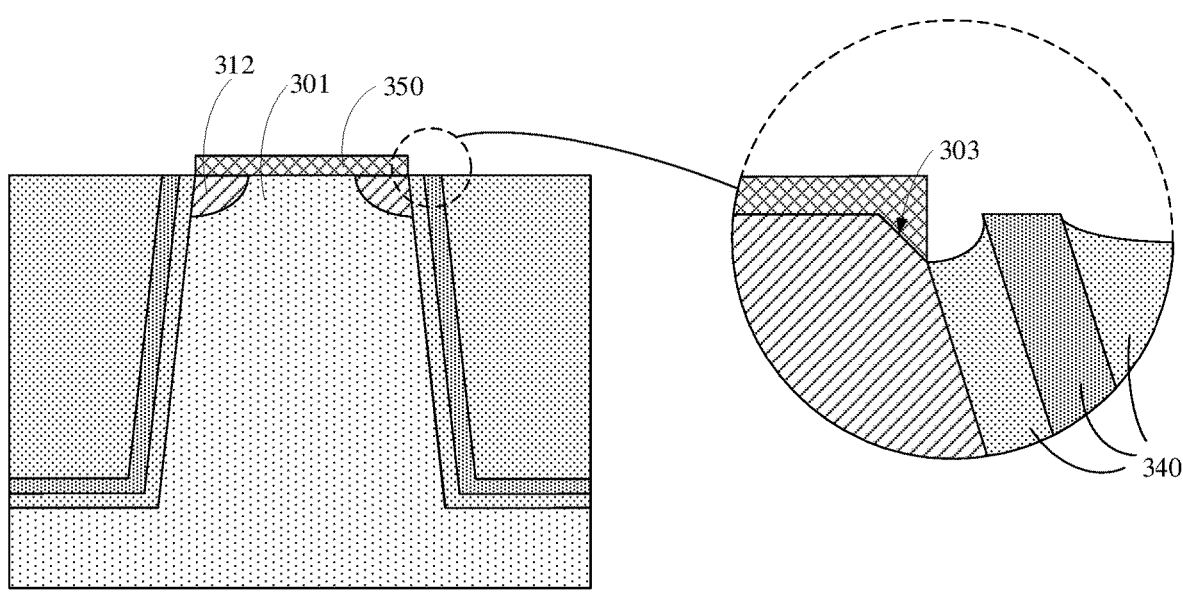

In another embodiment, referring to FIG. 14, the gate dielectric layer 350 further covers the side wall of each corner region 312, namely the surface of the chamfer 303. The gate dielectric layer 350 can play an isolation role in the corner region 312, which is beneficial to avoid the further oxidization of the corner region 312 and avoid the further consumption of the material of the corner region 312.

Figure 15:
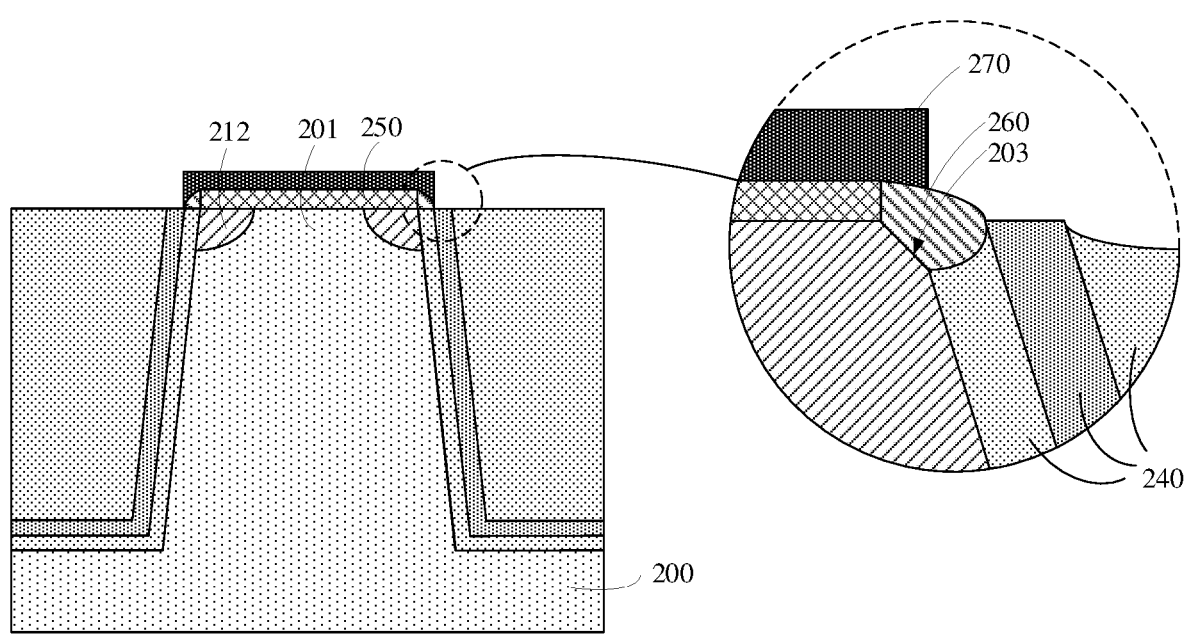

Referring to FIG. 15, an isolation part 260 and a gate 270 are formed.

In this embodiment, the side wall of the corner region 212 is exposed. In order to prevent the subsequently formed gate 270 from contacting with the side wall of the corner region 212, the extra isolation part 260 needs to be formed. The side wall of each corner region 212 is covered by the isolation part 260, to isolate the corner region 212 from the gate 270. This is beneficial to ensure better electric performance of a transistor composed of the gate 270, the gate dielectric layer 250 and the active region 201.

The material of the isolation part 260 may be identical to or different from the material of the gate dielectric layer 250.

In this embodiment, the oxidization rate of the corner region is slowed down by the doping ions implanted into the corner region, to avoid forming a thicker oxide layer, and avoid gradually forming a larger chamfer due to the faster removing rate for the oxide layer during the removing process. The better structural integrity of the corner region of the active region is ensured, and thus the better electric performance of the active region and the semiconductor structure including the active region, such as a field-effect tube, is ensured.

Correspondingly, the embodiments of this application further provide a semiconductor structure, which may be manufactured by the abovementioned method for manufacturing the semiconductor structure.

Referring to FIG. 15, the semiconductor structure includes a substrate 200. The substrate 200 includes active regions 201 and isolation regions each located between the adjacent active regions 201. Each of the active regions 201 includes corner regions 212 adjacent to the isolation regions. The side wall of each corner regions 212 is exposed from the structure in the isolation region. Each of the corner regions 212 contains doping ions, which are configured to slow down the oxidation rate of the corner region 212.

In this embodiment, each of the isolation regions has an isolation structure 240, which is provided with a recess 241 (referring to FIG. 12). The side wall of each corner region 212 is exposed from the recess 241.

In this embodiment, the semiconductor structure further includes a gate dielectric layer 250 and an isolation part 260. The top surface of each of the active regions 201 is covered by the gate dielectric layer 250, and the side wall of each of the corner regions is covered by the isolation part 260. In another embodiment, both of the top surface of the active region and the side wall of the corner region are covered by the gate dielectric layer.

In this embodiment, doping ions for slowing down the oxidization rate are contained in the corner region, which is beneficial to avoid a risk that more material of the corner region is consumed during a removing process. Thus, a better structural integrity of the corner regions is ensured.

In this embodiment, a trench is formed after the doping process, which is beneficial to restrain substrate oxidation during an etching process, and avoid the etching process etching a thicker oxide layer. Thus, it is possible to ensure that the chamfer formed by the etching process has a smaller size.

Those of ordinary skill in the art may understand that the abovementioned embodiments are specific embodiments for realizing this application. However, in actual application, various changes may be made to the forms and details without deviating from the spirit and scope of this application. Those skilled in any art may make respective change and modification without deviating from the spirit and scope of this application, therefore, the protection scope of this application shall be subjected the scope defined in claims.

The invention claimed is:

1. A method for manufacturing a semiconductor structure, comprising:
   providing a substrate, wherein the substrate comprises active regions and isolation regions each located between adjacent active regions of the active regions, and each of the active regions comprises corner regions adjacent to the isolation regions;
   performing a doping process to implant doping ions into the corner regions, wherein the doping ions are configured to slow down an oxidation rate of the corner regions;
   performing a removing process to remove an oxidized portion of the substrate after the doping process, wherein during the removing process, a side wall of each of the corner regions is exposed from a structure in the isolation region;
   performing a depositing process to each of the active regions to form a gate dielectric layer covering only a top surface of each of the active regions; and
   forming an isolation part covering the side wall of each of the corner regions, wherein a material of the isolation part is different from a material of the gate dielectric layer,
   wherein performing the removing process comprises:
      performing an etching process to the isolation regions to form trenches from which the side walls of the corner regions are exposed, wherein each of the trenches is configured to form an isolation structure.

2. The method for manufacturing the semiconductor structure of claim 1, wherein performing the removing process further comprises: performing a first cleaning process to the trenches after the etching process, wherein a cleaning liquid of the first cleaning process comes into contact with the side wall of each of the corner regions.

3. The method for manufacturing the semiconductor structure of claim 1, wherein each of the isolation structures has a recess, the side wall of each of the corner regions is exposed from the recess;
   performing the removing process comprises: performing a second cleaning process to the top surface of each of the active regions after the doping process, wherein in the second cleaning process, a cleaning liquid of the second cleaning process comes into contact with the side wall of each of the corner regions.

4. The method for manufacturing the semiconductor structure of claim 3, wherein the gate dielectric layer is formed after the second cleaning process, and
   the side wall of each of the corner regions is exposed from the gate dielectric layer and the isolation structure before the isolation part is formed.

5. The method for manufacturing the semiconductor structure of claim 1, wherein the doping ions comprise nitrogen ions, and an implantation dose of the doping ions is 1e12 to 1e16 atoms/cm$^2$.

6. The method for manufacturing the semiconductor structure of claim 1, wherein performing the doping process to implant the doping ions into the corner regions comprises:
   providing a shielding layer on the substrate, wherein each of the active regions further comprises a central region located between adjacent corner regions of the corner regions, the shielding layer covering a top surface of the central region, the shielding layer being configured to shield the implantation of the doping ions, and
   performing an ion implantation to the substrate.

7. The method for manufacturing the semiconductor structure of claim 6, wherein a scope of implantation energy of the ion implantation is 1 to 6 KV.

8. The method for manufacturing the semiconductor structure of claim 6, wherein the shielding layer further covers each of the corner regions, and each of the isolation regions is exposed from the shielding layer; and the ion implantation is performed to the substrate at an implantation angle.

9. The method for manufacturing the semiconductor structure of claim 8, wherein the implantation angle is 5 to 60 degrees.

10. The method for manufacturing the semiconductor structure of claim 5, wherein performing the doping process to implant the doping ions into the corner regions comprises:
providing a shielding layer on the substrate, wherein each of the active regions further comprises a central region located between adjacent corner regions of the corner regions, the shielding layer covering a top surface of the central region, the shielding layer being configured to shield the implantation of the doping ions, and
performing an ion implantation to the substrate.

11. A method for manufacturing a semiconductor structure, comprising:
providing a substrate, wherein the substrate comprises active regions and isolation regions each located between adjacent active regions of the active regions, and each of the active regions comprises corner regions adjacent to the isolation regions;
performing a doping process to implant doping ions into the corner regions, wherein the doping ions are configured to slow down an oxidation rate of the corner regions;
performing a removing process to remove an oxidized portion of the substrate after the doping process, wherein during the removing process, a side wall of each of the corner regions is exposed from a structure in the isolation region;
performing a depositing process to each of the active regions to form a gate dielectric layer covering only a top surface of each of the active regions; and
forming an isolation part covering the side wall of each of the corner regions, wherein a material of the isolation part is different from a material of the gate dielectric layer,
wherein each of the isolation regions is provided with an isolation structure having a recess, the side wall of each of the corner regions is exposed from the recess;
performing the removing process comprises: performing a second cleaning process to the top surface of each of the active regions after the doping process, wherein in the second cleaning process, a cleaning liquid of the second cleaning process comes into contact with the side wall of each of the corner regions, and
wherein the gate dielectric layer is formed after the second cleaning process, and the side wall of each of the corner regions is exposed from the gate dielectric layer and the isolation structure before the isolation part is formed.

12. A method for manufacturing a semiconductor structure, comprising:
providing a substrate, wherein the substrate comprises active regions and isolation regions each located between adjacent active regions of the active regions, and each of the active regions comprises corner regions adjacent to the isolation regions;
performing a doping process to implant doping ions into the corner regions, wherein the doping ions are configured to slow down an oxidation rate of the corner regions;
performing a removing process to remove an oxidized portion of the substrate after the doping process, wherein during the removing process, a side wall of each of the corner regions is exposed from a structure in the isolation region;
performing a depositing process to each of the active regions to form a gate dielectric layer covering only a top surface of each of the active regions; and
forming an isolation part covering the side wall of each of the corner regions, wherein a material of the isolation part is different from a material of the gate dielectric layer,
wherein performing the doping process to implant the doping ions into the corner regions comprises:
providing a shielding layer on the substrate, wherein each of the active regions further comprises a central region located between adjacent corner regions of the corner regions, the shielding layer covering a top surface of the central region, the shielding layer being configured to shield the implantation of the doping ions, and
performing an ion implantation to the substrate.

\* \* \* \* \*